(12) United States Patent
Cha et al.

(10) Patent No.: US 7,778,102 B2
(45) Date of Patent: Aug. 17, 2010

(54) SEMICONDUCTOR MEMORY DEVICE

(75) Inventors: Jae-Hoon Cha, Kyoungki-do (KR);
Ki-Chon Park, Kyoungki-do (KR)

(73) Assignee: Hynix Semiconductor, Inc.,
Gyeonggi-do (KR)

( * ) Notice: Subject to any disclaimer, the term of this patent is extended or adjusted under 35 U.S.C. 154(b) by 278 days.

(21) Appl. No.: 12/003,679

(22) Filed: Dec. 31, 2007

(65) Prior Publication Data
US 2008/0239862 A1 Oct. 2, 2008

(30) Foreign Application Priority Data
Mar. 31, 2007 (KR) ................ 10-2007-0032055

(51) Int. Cl.
*G11C 8/00* (2006.01)
(52) U.S. Cl. ............. 365/230.03; 365/189.08; 365/230.08
(58) Field of Classification Search ............ 365/230.03, 365/230.08, 189.08
See application file for complete search history.

(56) References Cited

U.S. PATENT DOCUMENTS 5,903,514 A * 5/1999 Sawada .................. 365/233.1
6,075,728 A * 6/2000 Inoue et al. ............... 365/189.2
6,531,911 B1 3/2003 Hsu et al.
6,876,250 B2 4/2005 Hsu et al.
7,138,823 B2 11/2006 Janzen et al.
2006/0111865 A1 5/2006 Choi
2006/0158214 A1 7/2006 Janzen et al.
2006/0200729 A1* 9/2006 Ito et al. ................... 714/763
2007/0040574 A1 2/2007 Janzen et al.

FOREIGN PATENT DOCUMENTS

JP 10-255467 9/1998
KR 10-2005-0076257 A 7/2005

OTHER PUBLICATIONS

Korean Office Action, with English Translation, issued in Korean Patent Application No. KR 10-2007-0032055, dated May 21, 2008.

* cited by examiner

*Primary Examiner*—Son Dinh
(74) *Attorney, Agent, or Firm*—IP & T Law Firm PLC

(57) ABSTRACT

The present invention provides a semiconductor memory device that can reduce unnecessary current consumption, as banks not accessing data maintain an inactivation state and do not receive an input address. A semiconductor memory device includes a plurality of banks grouped into a first group and a second group; and a bank control unit for selecting one of the first group and the second group in response to a bank address to transfer an address to the selected group.

18 Claims, 7 Drawing Sheets

SEMICONDUCTOR MEMORY DEVICE

CROSS-REFERENCE TO RELATED APPLICATIONS

This application claims priority of Korean patent application number 10-2007-0032055 filed on Mar. 31, 2007, which is incorporated by reference in their entirety.

BACKGROUND OF THE INVENTION

The subject matter relates to semiconductor devices and more particularly to semiconductor memory devices with an improved method for transferring addresses.

A semiconductor memory device may include millions or billions of memory cells to be accessed. Generally, all memory cells of the semiconductor memory device are arranged in a matrix for effective addressing that is called a cell area. Each cell of the matrix is crossed by a word line and a bit line. Thus, each memory cell can be accessed by a selected word line and a selected bit line in a cell area of the matrix. The semiconductor memory device decodes a row address and a column address transferred from a memory controller to select a word line and a bit line in the cell area. The semiconductor memory device receives a row address and a column address through address pads, and receives or outputs data through data pads. Typically, the data pads and the address pads require relatively a large region in a chip area of the semiconductor memory device. To reduce the number of pads, the semiconductor memory device receives the row address and the column address through a common address pad.

In order to store more data in a semiconductor memory device, memory cells are designed as small as design technology for manufacturing a semiconductor device allows. Because of that, a data signal stored in a memory cell is very small, and is not sufficient to directly use as an output data. Hence, a data signal stored in a memory cell is transferred to and amplified by an amplifying circuit because the magnitude of the data signal is very small. Further, an original data signal stored in the memory cell may be destroyed during the transferring and amplifying process. Thus, after the amplified data signal is output externally, the data signal amplified by the amplifying circuit should be restored into the selected memory cell. Because of the amplifying time and the restoring time, the semiconductor memory device can not continuously output data, although a memory controller seeks continuous data from the semiconductor memory device. After one data is output externally, a latency time, caused by the amplifying time and the restoring time, occurs prior to externally outputting a next data.

To reduce the latency time, recent designs of semiconductor memory devices have at least two or more banks. Each bank of such a semiconductor memory device includes a group of memory cells and can independently access its own memory cells. While one bank externally outputs a data, another bank prepares to externally output a next data. Because the banks can alternatively output data, the memory controller can continuously receive a plurality of data from the semiconductor memory device without latency time. In the semiconductor memory device with a plurality of banks, a bank should be selected to access a memory cell. Thus, the semiconductor memory device with the plurality of banks receives not only a row and a column address, but also a bank address from the memory controller. The semiconductor memory device selects one of banks using the bank address, and then at least one cell of the selected bank is chosen by the row address and the column address. The memory controller can continuously receive data from the semiconductor memory device if the bank address is selected alternately.

FIG. 1 is a block diagram of a conventional semiconductor memory device having a plurality of banks. As shown, the semiconductor memory device includes an address input unit 100, a command decoding unit 120, a plurality of address transferring units 190A to 190H, and a plurality of banks, i.e., first bank, comprising BANK00, BANK10, BANK20, and BANK30 to eighth bank, comprising BANK07, BANK17, BANK27, and BANK37. The address input unit 100 receives a bank address BANK_ADD<3Bit> and a row address ADD<12Bit> to generate a bank selecting signal BANKT<0:7> and an internal row address ROW_ADD<0:11>. The command decoding unit 120 generates a row pulse signal ROWP in response to an active command signal ACT. The address transferring units 190A to 190H transfer the internal row address ROW_ADD<0:11> to the plurality of banks in response to the row pulse signal ROWP.

Each bank in the semiconductor memory device is divided into four bank blocks. That is, one bank is separated into four bank blocks, and each bank block is arranged in a respective area of which is called a quarter bank area. For example, a first bank is composed of the four bank blocks BANK00, BANK10, BANK20, and BANK30. Because there are eight banks in the example shown in FIG. 1, each of the quarter bank areas 140, 150, 160, and 170 includes eight bank blocks. Once a command for data access is input to the semiconductor memory device, one of the eight banks is first selected and a predetermined amount of data, e.g., 16 or 32 bits of data, is output from the selected bank. In case of 16-bit data output, each bank block outputs 4 bits of data through corresponding data pads. Typically, data pads are arranged at each side a memory circuit area. As the distance between the selected bank and data pads becomes shorter, data from the selected bank can be more quickly output externally. To reduce the distance between a selected bank and the data pads, each bank is separated to four bank blocks, with each bank block arranged in a respective quarter bank area as shown.

A bank block of eight bank blocks in each quarter bank area 140 to 170 is chosen by the bank select signal BANKT<0:7> in response to the row pulse signal ROWP. At least one memory cell is chosen by the internal row address ROW_ADD<0:11> in each of the chosen bank blocks. A data access occurs at the chosen memory cell. The row pulse signal ROWP from the command decoding unit 120 is a control signal for announcing that the internal row address ROW_ADD<0:11> is generated. Whenever the row pulse signal ROWP is generated, each of the address transferring units 190A to 190H transfers the internal row address ROW_ADD<0:11> to corresponding bank blocks of 32 bank blocks BANK00 to BANK37. For instance, the address transferring unit 190A transfers the internal row address ROW_ADD<0:11> to corresponding bank blocks BANK00 to BANK03 of the first quarter bank area 140 in response to the row pulse signal ROWP.

FIG. 2 is a schematic diagram showing a part of the address transferring unit 190A in FIG. 1. The address transferring units 190A to 190H share substantially the same configuration. Therefore, for the sake of convenience, the part of the address transferring unit 190A is shown and explained as an example of the address transferring units 190A to 190H, and the diagram of the other address transferring units 190B to 190H are omitted. The address transferring unit 190A includes a transmission gate TG for transferring an internal address signal ROW_ADD<0> in response to the row pulse signal ROWP and a latch unit 191 for latching an output of the transmission gate TG to output an internal row address ROW_ADDI<0>. The address transferring unit 190A includes also another eleven transmission gates and another eleven latch units for transferring and latching the other internal address signals ROW_ADD<1:11>. For the sake of convenience, the another eleven transmission gates and eleven latch units are not shown in FIG. 2.

FIG. 3 is a timing diagram showing an operation for transferring the internal row address ROW_ADD<0:11> to the bank blocks in the four quarter bank areas. Whenever the row pulse signal ROWP is pulsed from the command decoding unit 120, one of the bank selecting signals BANKT<0:7> is enabled by the address input unit 100 and activates corresponding bank blocks. The internal row address ROW_ADDI<0:11> is transferred into each bank in response to the row pulse signal ROWP. Each bank block is enabled in response to a corresponding one of the bank selecting signals BANKT<0:7>, and at least one memory cell of the enabled bank block is selected by the internal row address ROW_ADDI<0:11>. For example, once the bank selection signal BANKT1 is enabled, the internal row address ROW_ADDI<0:11> is transferred to the 32 bank blocks in response to the row pulse signal ROWP and the four bank blocks BANK01, BANK11, BANK21, and BANK31 are enabled. If the bank selection signal BANKT5 is enabled, the internal row address ROW_ADDI<0:11> is transferred to the 32 bank blocks in response to the row pulse signal ROWP and the four bank blocks BANK05, BANK15, BANK25, and BANK35 are enabled.

Although only one of the bank selecting signals BANKT<0:7> is enabled at a time, the internal row address ROW_ADDI<0:11> is transferred into all of the bank blocks. Because the address transferring units 190A to 190H do not receive any signal having information for which of eight banks is selected, the address transferring units 190A to 190H transfer the internal row address ROW_ADDI<0:11> to all bank blocks. Whenever the row pulse signal ROWP is pulsed, each bank blocks receives the internal row address ROW_ADDI<0:11> and determines whether the received internal row address ROW_ADDI<0:11> is used in response to its respective bank selecting signal.

According to the semiconductor memory device in FIG. 1, whenever the row pulse signal ROWP is pulsed, the internal row address ROW_ADDI<0:11> is transferred to all of the bank blocks, and each bank block determines whether the transferred internal row address ROW_ADDI<0:11> is used or not. However, most of the bank blocks do not need to be enabled, except the four bank blocks corresponding to each of the bank selecting signals BANKT<0:7>. In other words, the internal row address is transferred to bank blocks that do not need to use the internal row address ROW_ADDI<0:11> and each of the bank blocks makes its own determination as to whether the transferred internal row address ROW_ADDI<0:11> is used or not. As a result, the semiconductor memory device should consume unnecessary current because all of the bank blocks are maintained an enabled state. As the number of the banks or memory cells included in a semiconductor memory device increases, the unnecessarily consumed current may become more significant.

SUMMARY OF THE INVENTION

Embodiments of the present invention are directed to providing a semiconductor memory device that can reduce unnecessary current consumption because banks not to access data maintain inactivation state and do not receive the inputted address.

In accordance with the disclosure, there is provided a semiconductor memory device including a plurality of banks grouped into a first group and a second group, each group including at least one of the banks, and no bank in the first group also in the second group; and a bank control unit for selecting one of the first group and the second group in response to a bank address to transfer an address to the selected group.

Also in accordance with the disclosure, there is provided a semiconductor memory device with a plurality of banks, including at least two bank areas respectively including at least two bank blocks wherein each bank is separated into at least two bank blocks and each bank block of one bank is arranged at a respective bank area, and wherein the plurality of banks are grouped into a first group and a second group; and a bank control unit for selecting one of the first group and the second group in response to a bank address to transfer an address to the selected group.

Additionally, in accordance with the disclosure, there is provided a method for operating a semiconductor memory device with a plurality of banks grouped into a first group and a second group, including selecting one of first group and the second group according to a bank address; and transferring a row address to the selected group.

DETAILED DESCRIPTION

Figure 4:
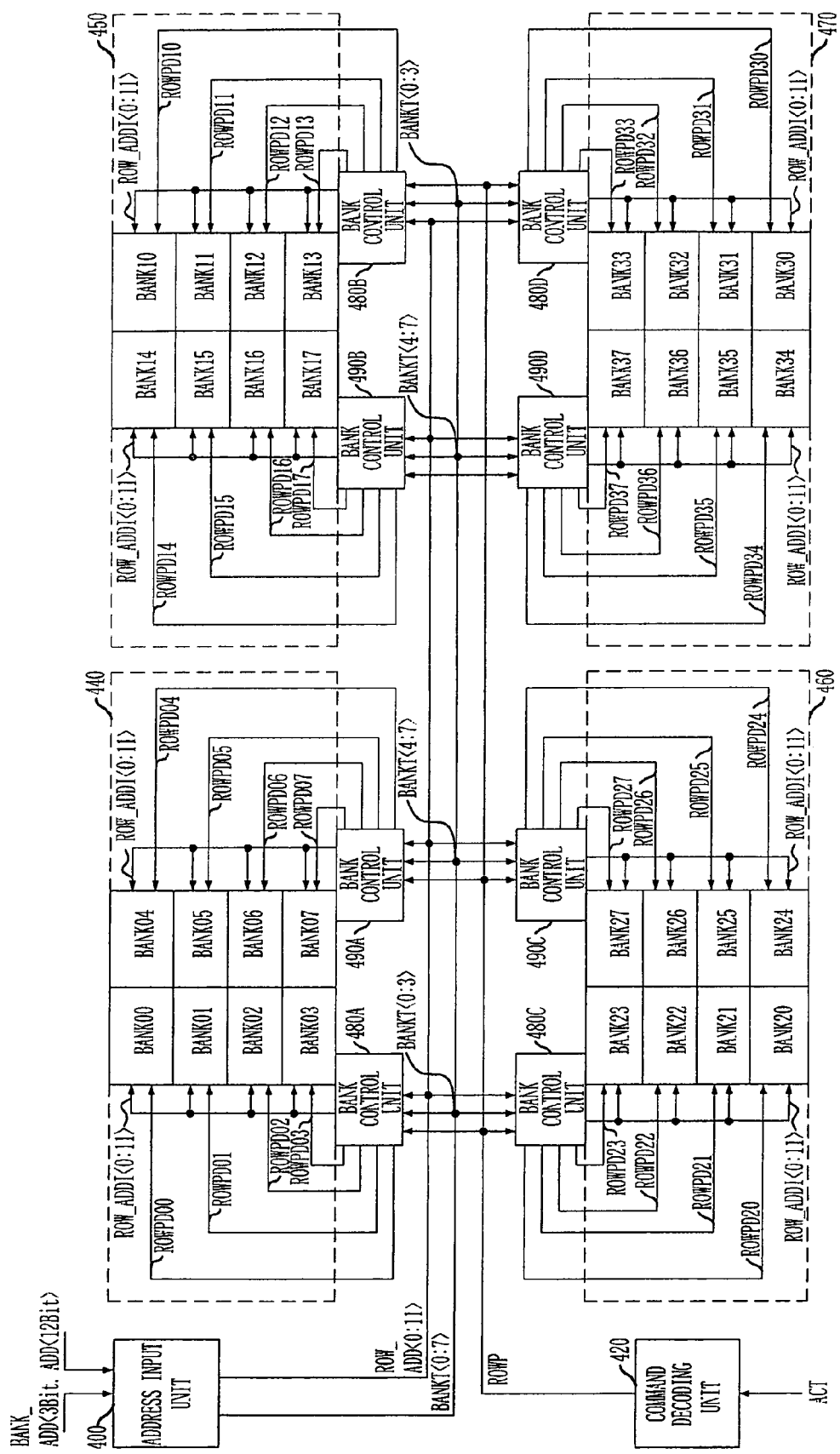
FIG. 4 is a block diagram illustrating a first embodiment of the present invention.

FIG. 4 is a block diagram illustrating a first embodiment of the present invention. As shown, the semiconductor memory device includes an address input unit 400, a command decoding unit 420, a plurality of bank control units 480A to 480D and 490A to 490D, and a plurality of banks, i.e., first bank (comprising bank blocks BANK00, BANK10, BANK20, and BANK30) to eighth bank (comprising bank blocks BANK07, BANK17, BANK27, and BANK37). The address input unit 400 receives a bank address BANK_ADD<3Bit> and a row address ADD<12Bit> to generate a bank selecting signal BANKT<0:7> and an internal row address ROW_ADD<0:11>. The command decoding unit 420 decodes an active command signal ACT to generate a row pulse signal ROWP. The bank control units 480A to 480D and 490A to 490D enable at least one of the banks by activating at least one of bank enable signals ROWPD00 to ROWPD07, ROWPD10 to ROWPD17, ROWPD20 to ROWPD27 and ROWPD30 to ROWPD37 in response to the row pulse signal ROWP. The bank enable signals ROWPD00 to ROWPD07, ROWPD10 to ROWPD17, ROWPD20 to ROWPD27 and ROWPD30 to ROWPD37 correspond to bank selection signals BANKT<0:

7>. Also, the bank control units 480A to 480D and 490A to 490D receive the internal row address ROW_ADD<0:11> to output the internal row address ROW_ADDI<0:11> to the banks.

Each bank is divided into at least two bank blocks to reduce the physical distance between each bank and data pads. According to the first embodiment, there are eight banks in the semiconductor memory device and each bank is divided into four bank blocks, with each bank blocks arranged in a respective one of quarter bank areas 440, 450, 460, and 470. Thus, each quarter bank area includes eight bank blocks. The eight bank blocks in each quarter bank area are divided into a first group and a second group. Thus, the eight banks are divided into two groups. Each of the bank control units 480A to 480D and 490A to 490D corresponds to a group of four bank blocks. As illustrated, bank control unit 480A selects one of the four bank blocks BANK00 to BANK03 in response to bank selection signals BANKT<0:3> and the row pulse signal ROWP, and receives the internal row address ROW_ADD<0:11> to supply an internal row address ROW_ADDI<0:11> to a selected bank block. Bank control unit 490A, corresponding to the same quarter bank area 440 as bank control unit 480A, selects one of the four bank blocks BANK04 to BANK07 in response to bank selection signals BANKT<4:7> and the row pulse signal ROWP, and receives the internal row address ROW_ADD<0:11> to supply the internal row address ROW_ADDI<0:11> to a selected bank block.

For example, assuming that the third bank selection signal BANKT2 is enabled, the bank control units 480A to 480D enable the bank blocks BANK02, BANK12, BANK22, and BANK32 corresponding to third bank selection signal BANKT2. The bank control units 480A to 480D transfer the internal row address ROW_ADDI<0:11> to the corresponding bank blocks. Thus, the four bank blocks BANK02, BANK12, BANK22, and BANK32 of the third bank are enabled and data accesses are performed in the enabled bank blocks BANK02, BANK12, BANK22, and BANK32.

For another example, assuming that the sixth bank selection signal BANKT5 is enabled, the bank control units 490A to 490D enable the bank blocks BANK05, BANK15, BANK25, and BANK35 corresponding to sixth bank selection signal BANKT5, while the bank control units 480A to 480D are inactivated. The bank control units 490A to 490D transfer the internal row address ROW_ADDI<0:11> to the corresponding bank blocks. Thus, the four bank blocks BANK05, BANK15, BANK25, and BANK35 of the sixth bank are enabled and data accesses are performed in the enabled bank blocks BANK05, BANK15, BANK25, and BANK35.

Figure 5A:
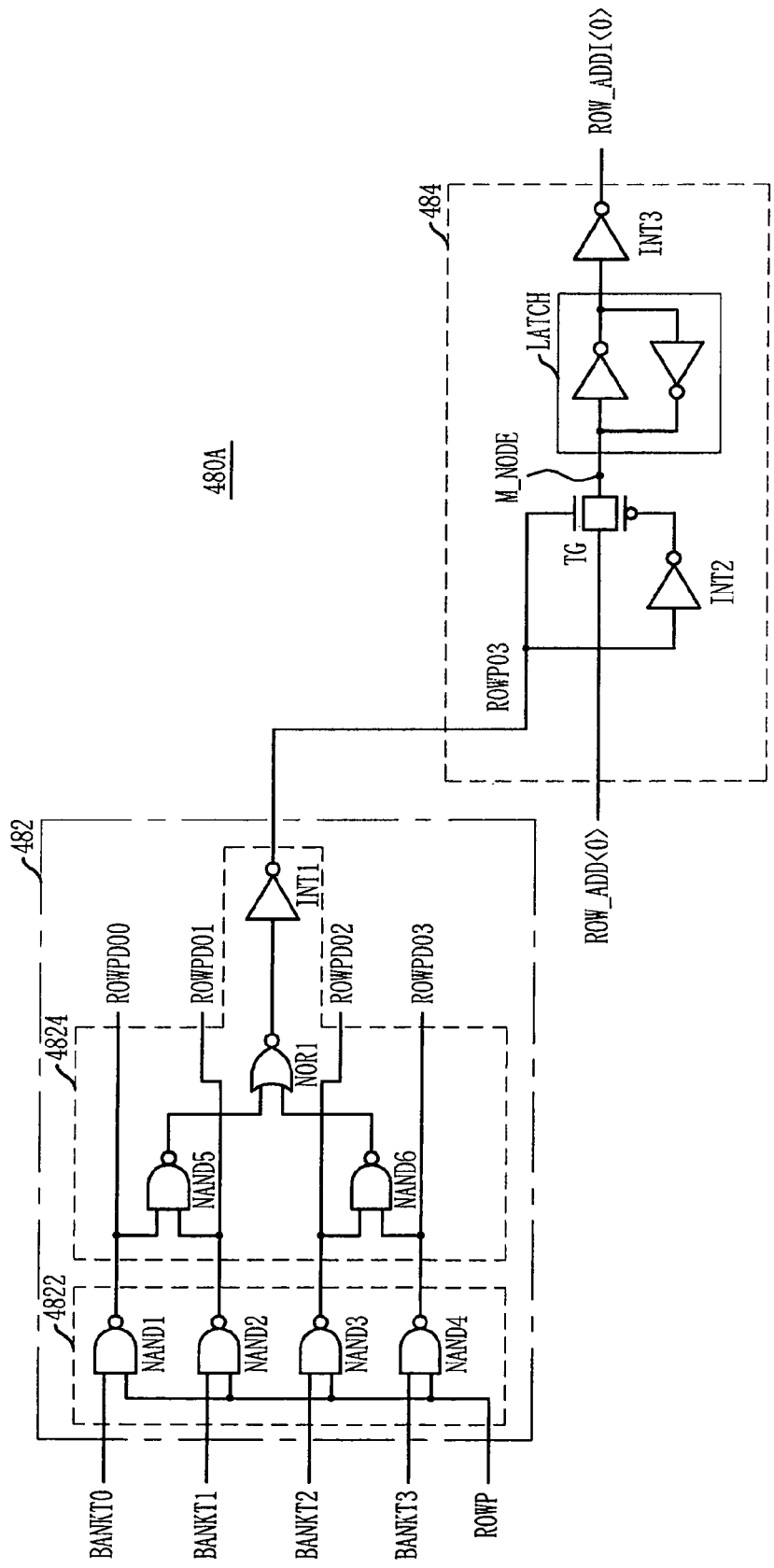
FIG. 5A is a schematic diagram illustrating a part of the bank control unit 480A illustrated in FIG. 4.

FIG. 5A is a schematic diagram illustrating a part of the bank control unit 480A illustrated in FIG. 4. The address transferring units 480A to 480D and 490A to 490D share substantially the same configuration. For the sake of convenience, the illustrated part of the bank control unit 480A is a representative example of corresponding parts of the address transferring units 480A to 480D, and diagrams of the other bank control units 480B to 480D are omitted. As illustrated, the bank control unit 480A includes a bank selection unit 482 and an address transfer unit 484. The bank selection unit 482 activates one of the bank enable signals ROWPD00 to ROWPD03 in response to bank selection signals BANKT<0:3> and the row pulse signal ROWP, and generates a bank group selection signal ROWP03 in response to an activation of one of the bank enable signals ROWPD00 to ROWPD03. The address transfer unit 484 transfers the internal row address ROW_ADD<0> in response to the bank group selection signal ROWP03.

The bank selection unit 482 includes a bank selection signal generating unit 4822 and a bank group selection signal generating unit 4824. The bank selection signal generating unit 4822 performs logic operations in response to the row pulse signal ROWP and the bank selection signals BANKT<0:3> to enable at least one of the bank enable signals ROWPD00 to ROWPD03. The bank group selection signal generating unit 4824 generates the bank group selection signal ROWP03 in response to an activation of one of the bank enable signals ROWPD00 to ROWPD03.

The bank selection signal generating unit 4822 includes a first signal combination unit, i.e., a logic NAND gate NAND1 for performing the logic NAND operation of the row pulse signal ROWP and the first bank selection signal BANKT0 to output a first bank enable signal ROWPD00 for selecting the first bank, a second signal combination unit, i.e., a logic NAND gate NAND2 for performing the logic NAND operation of the row pulse signal ROWP and a second bank selection signal BANKT1 to output a second bank enable signal ROWPD01 for selecting the second bank, a third signal combination unit, i.e., a logic NAND gate NAND3 for performing the logic NAND operation of the row pulse signal ROWP and the third bank selection signal BANKT2 to output a third bank enable signal ROWPD02 for selecting the third bank, and a fourth signal combination unit, i.e., a logic NAND gate NAND4 for performing the logic NAND operation of the row pulse signal ROWP and a fourth bank selection signal BANKT3 to output a fourth bank enable signal ROWPD03 for selecting the fourth bank.

The bank group selection signal generating unit 4824 includes a fifth signal combination unit, i.e., a logic NAND gate NAND5 for performing the logic NAND operation of an output of the logic NAND gate NAND1 and an output of the logic NAND gate NAND2, a sixth signal combination unit, i.e., a logic NAND gate NAND6 for performing the logic NAND operation of an output of the logic NAND gate NAND3 and an output of the logic NAND gate NAND4, a seventh signal combination unit, i.e., a logic NOR gate NOR1 for performing the logic NAND operation of an output of the logic NAND gate NAND5 and an output of the logic NAND gate NAND6, and an inverter INT1 for inverting an output of the logic NOR gate NOR1 to output the detecting signal ROWP03.

The address transfer unit 484 includes a transmission gate TG for receiving the internal row address signal ROW_ADD<0> in response to the bank group selection signal ROWP03 to output the internal row address signal ROW_ADDI<0>, a latch unit LATCH for latching a signal transferred by the transmission gate TG, and an inverter INT3 for inverting an output of the latch LATCH. The address transferring unit 484 includes also another eleven transmission gates and another eleven latch units for transferring and latching the other internal address signals ROW_ADD<1:11> although the eleven transmission gates circuits and the eleven latch units are not shown in FIG. 5A, for the sake of convenience.

Figure 5B:
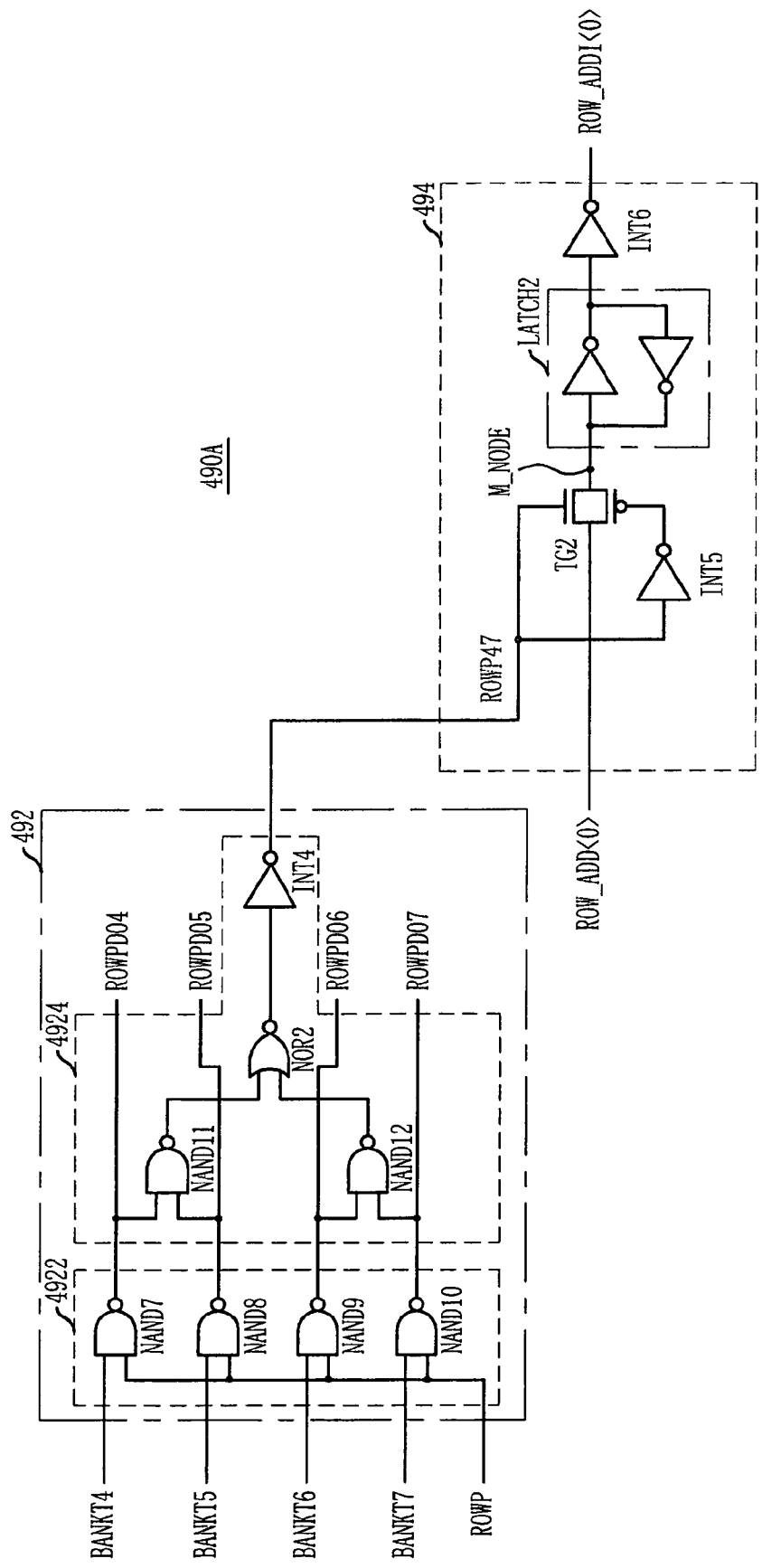
FIG. 5B is a schematic diagram illustrating a part of the bank control unit 490A illustrated in FIG. 4.

FIG. 5B is a schematic diagram illustrating a part of the bank control unit 490A illustrated in FIG. 4. As shown, the bank control unit 490A includes a bank selection unit 492 and an address transfer unit 494. The bank selection unit 492 generates a plurality of bank enable signals ROWPD04 to ROWPD07 to enable at least one of the banks corresponding to bank selection signals BANKT<4:7> in response to the row pulse signal ROWP, and generates a bank group selection signal ROWP47 in response to an activation of one of the bank enable signals ROWPD04 to ROWPD07. The address transfer unit 494 transfers the internal row address ROW_ADD<0> to the enabled bank in response to the bank group selection signal ROWP47.

The bank selection unit 492 includes a bank selection signal generating unit 4922 and a bank group selection signal generating unit 4924. The bank selection signal generating unit 4922 performs logic NAND operations in response to the row pulse signal ROWP and the bank selection signals BANKT<4:7> to enable at least one of the bank enable signals ROWPD04 to ROWPD07. The bank group selection signal generating unit 4924 generates the bank group selection signal ROWP47 in response to an activation of one of the bank enable signals ROWPD04 to ROWPD07.

The bank selection signal generating unit 4922 includes a first signal combination unit, i.e., a logic NAND gate NAND7 for performing the logic NAND operation of the row pulse signal ROWP and the fifth bank selection signal BANKT4 to output a fifth bank enable signal ROWPD04 for selecting the fifth bank, a second signal combination unit, i.e., a logic NAND gate NAND8 for performing the logic NAND operation of the row pulse signal ROWP and a sixth bank selection signal BANKT5 to output a sixth bank enable signal ROWPD05 for selecting the sixth bank, a third signal combination unit, i.e., a logic NAND gate NAND9 for performing the logic NAND operation of the row pulse signal ROWP and the seventh bank selection signal BANKT6 to output a seventh bank enable signal ROWPD06 for selecting the third bank, and a fourth signal combination unit, i.e., a logic NAND gate NAND10 for performing the NAND logic operation of the row pulse signal ROWP and an eighth bank selection signal BANKT7 to output an eighth bank enable signal ROWPD07 for selecting the eighth bank.

The bank group selection signal generating unit 4924 includes a fifth signal combination unit, i.e., a logic NAND gate NAND11 for performing the logic operation of an output of the logic NAND gate NAND7 and an output of the logic NAND gate NAND8, a sixth signal combination unit, i.e., a logic NAND gate NAND12 for performing the logic operation of an output of the logic NAND gate NAND9 and an output of the logic NAND gate NAND10, a seventh signal combination unit, i.e., a logic NOR gate NOR2 for performing the logic operation of an output of the logic NAND gate NAND11 and an output of the logic NAND gate NAND12, and an inverter INT4 for inverting an output of the logic NOR gate NOR2.

The address transfer unit 494 includes a transmission gate TG for receiving the internal row address signal ROW_ADD<0> in response to the bank group selection signal ROWP47 to output the internal row address signal ROW_ADDI<0>, a latch unit LATCH for latching a signal transferred by the transmission gate TG2, and an inverter INT6 for inverting an output of the latch LATCH2. Although other circuits are not shown in FIG. 5B, the address transferring unit 494 includes also another eleven transmission gates and anther eleven latch units for transferring and latching the other internal address signals ROW_ADD<1:11>, respectively.

Figure 6:
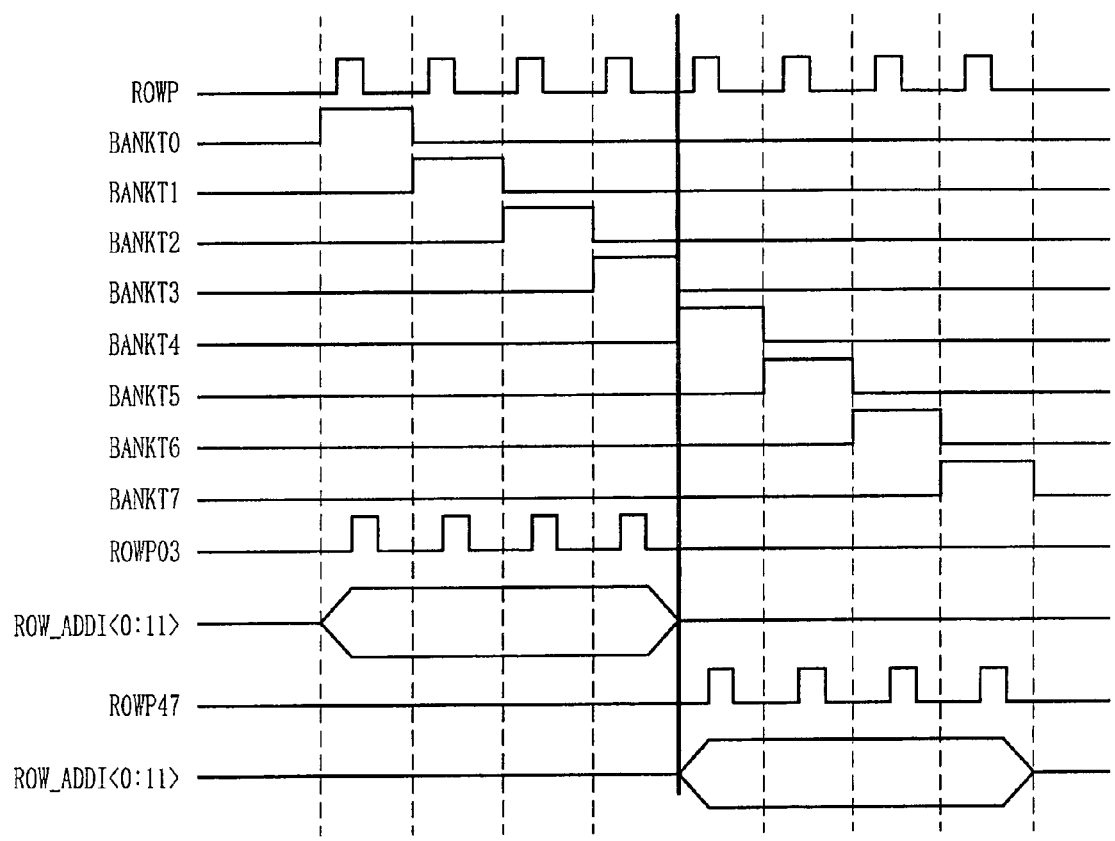
FIG. 6 is a timing diagram showing an operation for transferring an internal row address to each bank block in the semiconductor memory device illustrated in FIG. 4.

FIG. 6 is a timing diagram showing an operation for transferring an internal row address to each bank block in the semiconductor memory device illustrated in FIG. 4. Whenever the row pulse signal ROWP is pulsed, one of the bank selection signals BANKT0 to BANKT7 is activated. The bank selection unit 482 generates the bank group selection signal ROWP03 and activates one of bank enable signals ROWPD00 to ROWPD03 in response to one of the bank selection signals BANKT0 to BANKT3 being activated. The bank blocks corresponding to the activated bank enable signal are enabled. The address transfer unit 484 transfers the internal row address ROW_ADD<0:11> to the enabled bank blocks in response to the bank group selection signal ROWP03. The bank selection unit 492 generates the bank group selection signal ROWP47 and activates one of bank enable signals ROWPD04 to ROWPD07 whenever one of the bank selection signals BANKT4 to BANKT7 is activated. The bank blocks corresponding to the activated bank enable signal are enabled. The address transfer unit 494 transfers the internal row address ROW_ADD<0:11> to the enabled bank blocks in response to the bank group selection signal ROWP47.

Figure 1:
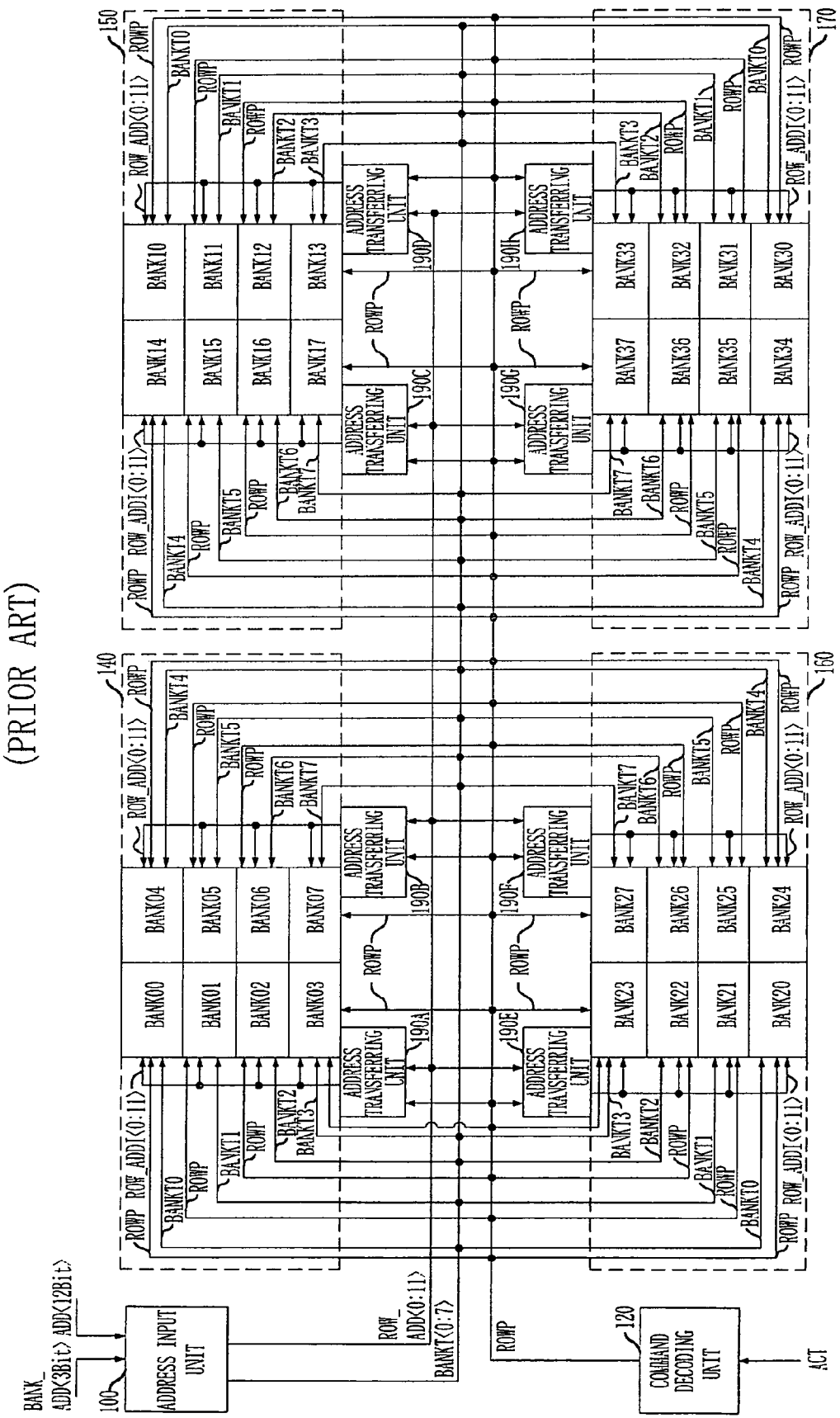
FIG. 1 is a block diagram of a conventional semiconductor memory device having a plurality of banks.
Figure 2:
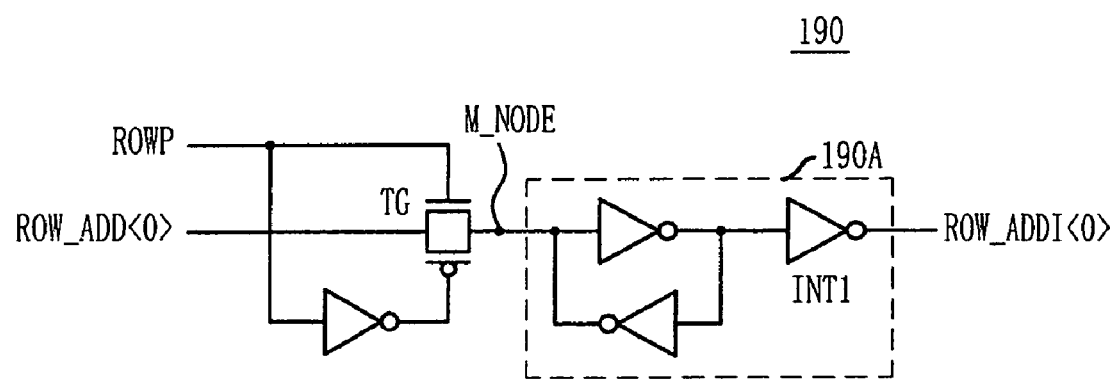
FIG. 2 is a schematic diagram showing a part of the address transferring unit 190A of FIG. 1
Figure 3:
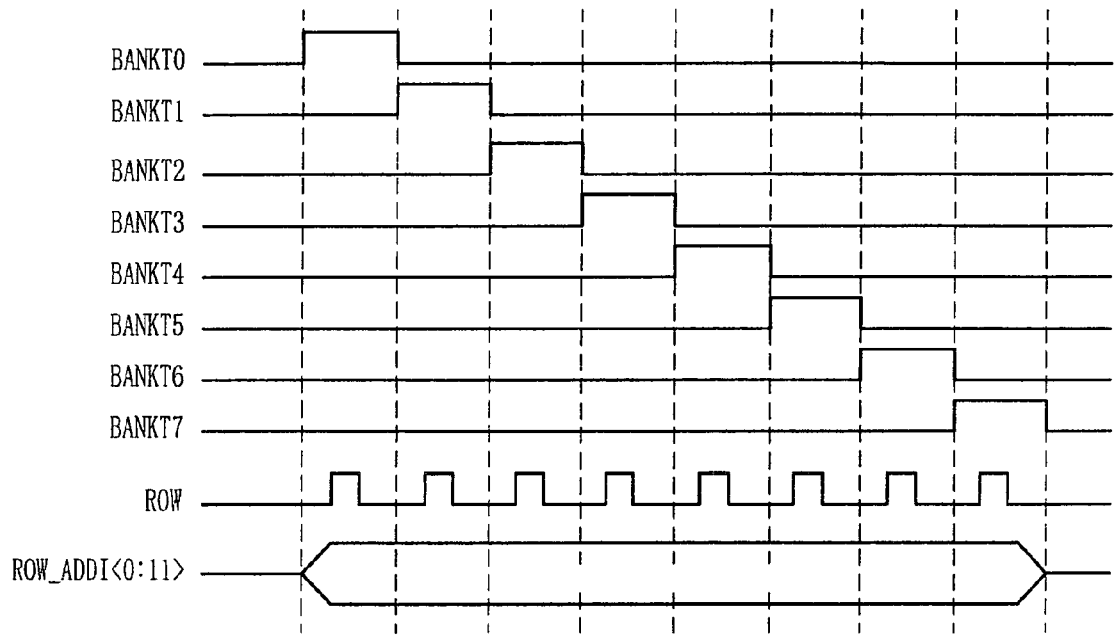
FIG. 3 is a timing diagram showing an operation for transferring an internal row address to each bank block in the conventional semiconductor memory device in FIG. 1.

As described above, the eight banks are divided into two groups. The one group includes the first to fourth banks and the second group includes the fifth to eighth banks. The internal row address ROW_ADD<0:11> is transferred to only one of two groups. In embodiments according to the invention, the internal row address ROW_ADD<0:11> is just transferred to four banks. Because every bank does not need to receive the internal row address ROW_ADD<0:11>, the present invention can reduce current consumption in comparison with conventional devices in which all banks have to receive the internal row address ROW_ADD<0:11>, as illustrated in FIG. 1.

According to the present invention, a semiconductor memory device including a plurality of banks can transfer an input address directly to banks needed to access data. Therefore, unnecessary current consumption can be reduced because banks not accessing data maintain an inactivation state and do not receive the input address.

The present invention has been described with respect to the specific embodiments, it will be apparent to those skilled in the art that various changes and modifications may be made without departing from the spirit and scope of the invention as defined in the following claims. For example, those skilled in the art that appreciate that the number of the quarter bank areas or banks can be changed and the number grouped by banks can be adjusted. Also, the present invention can be adapted to address control circuits for transferring column addresses.

What is claimed is:

1. A semiconductor memory device, comprising:
    a plurality of banks grouped into a first group and a second group, each group including at least two of the banks; and
    bank control units, each bank control unit configured to transfer an address to a corresponding group of the first and second groups in response to a corresponding bank address,
    wherein each bank control unit includes:
    a bank selection unit configured to generate a bank enable signal for activating a bank in the corresponding group and to generate a bank group selection signal, in response to the corresponding bank address and an internal command; and
    an address transfer unit configured to transfer the address to the corresponding group in response to the bank group selection signal.

2. The semiconductor memory device of claim 1, wherein the internal command is an active command and the address is a row address.

3. The semiconductor memory device of claim 2, wherein the bank selection unit includes:
    a bank selection signal generating unit configured to perform a logic operation in response to the internal command and the corresponding bank address to generate the bank enable signal for the activated bank in the corresponding group; and a bank group selection signal generating unit configured to generate the bank group selection signal in response to the activation of the bank enable signal.

4. The semiconductor memory device of claim 3, wherein the bank selection signal generating unit includes:

a first signal combination unit for performing a logic operation on the internal command and a first signal of the corresponding bank address to output a first bank enable signal for selecting a first bank;

a second signal combination unit for performing a logic operation on the internal command and a second signal of the corresponding bank address to output a second bank enable signal for selecting a second bank;

a third signal combination unit for performing a logic operation on the internal command and a third signal of the corresponding bank address to output a third bank enable signal for selecting a third bank; and a fourth signal combination unit for performing a logic operation on the internal command and a fourth signal of the corresponding bank address to output a fourth bank enable signal for selecting a fourth bank;

wherein the bank enable signal includes the first bank enable signal, the second bank enable signal, the third bank enable signal and the fourth bank enable signal; and the first group includes the first bank, the second bank, the third bank, and the fourth bank.

5. The semiconductor memory device of claim 4, wherein the bank group selection signal generating unit includes:

a fifth signal combination unit for performing a logic operation on an output of the first signal combination unit and an output of the second signal combination unit;

a sixth signal combination unit for performing a logic operation on an output of the third signal combination unit and an output of the fourth signal combination unit; and a seventh signal combination unit for performing a logic operation on an output of the fifth signal combination unit and an output of the sixth signal combination unit.

6. The semiconductor memory device of claim 5, wherein the address transfer unit includes:

a transmission circuit for transferring the row address in response to the bank group selection signal; and a latch unit for latching the row address transferred by the transmission circuit.

7. The semiconductor memory device of claim 1, further comprising a command decoder configured to decode an externally supplied active command signal to generate the internal command.

8. The semiconductor memory device of claim 7, further comprising an address input circuit configured to receive an externally supplied row address to output the row address to the bank control units.

9. A semiconductor memory device with a plurality of banks, comprising:

at least two bank areas respectively including at least two bank blocks wherein each bank is separated into at least two bank blocks and each bank block of one bank is arranged at a respective bank area, and wherein the plurality of banks are grouped into a first group and a second group; and bank control units, each bank control unit configured to transfer an address to a corresponding group of bank blocks belonging to one of the first and second groups, wherein each bank control unit includes:

a bank selection unit configured to generate a bank enable signal for activating a bank block in the corresponding group and to generate a bank group selection signal, in response to corresponding bank selection signals and an internal command; and an address transfer unit configured to transfer the address to the corresponding group in response to the bank group selection signal.

10. The semiconductor device of claim 9, wherein the address is a row address.

11. The semiconductor memory device of claim 10, wherein the bank selection unit includes:

a bank selection signal generating unit configured to perform logic operations in response to the internal command and the corresponding bank selection signals to enable the bank enable signal; and a bank group selection signal generating unit for generating the bank group selection signal in response to an activation of the bank enable signal.

12. The semiconductor memory device of claim 11, wherein the bank selection signal generating unit includes:

a first signal combination unit for performing a logic operation on the internal command and a first signal of the corresponding bank selection signals to output a first bank enable signal for enabling a first bank;

a second signal combination unit for performing a logic operation on the internal command and a second signal of the corresponding bank selection signals to output a second bank enable signal for enabling a second bank;

a third signal combination unit for performing a logic operation on the internal command and a third signal of the corresponding bank selection signals to output a third bank enable signal for enabling a third bank; and a fourth signal combination unit for performing a logic operation on the internal command and a fourth signal of the corresponding bank selection signals to output a fourth bank enable signal for enabling a fourth bank;

wherein the corresponding bank enable signals include the first bank enable signal, the second bank enable signal, the third bank enable signal and the fourth bank enable signal.

13. The semiconductor memory device of claim 12, wherein the bank group selection signal generating unit includes:

a fifth signal combination unit for performing a logic operation on an output of the first signal combination unit and an output of the second signal combination unit;

a sixth signal combination unit for performing a logic operation on an output of the third signal combination unit and an output of the fourth signal combination unit; and a seventh signal combination unit for performing a logic operation on an output of the fifth signal combination unit and an output of the sixth signal combination unit.

14. The semiconductor memory device of claim 13, wherein the address transfer unit includes:

a transmission circuit for transferring the row address in response to the bank group selection signal; and a latch unit for latching the row address transferred by the transmission circuit.

15. The semiconductor memory device of claim 9, further comprising a command decoder configured to decode an externally supplied active command signal to generate the internal command provided to the bank control units.

16. The semiconductor memory device of claim 15, further comprising an address input circuit configured to receive an externally supplied row address to output the row address to the bank control units.

17. A method for operating a semiconductor memory device with a plurality of banks grouped into a first group and a second group, comprising:

transferring a row address to the first group, including at least two of the plurality of banks. in response to an internal command and a first bank address; and transferring the row address to the second group in response to the internal command and a second bank address, wherein the transferring of the row address to the first group includes:

generating a bank enable signal for activating a bank corresponding to the first bank address and generating a bank group selection signal in response to the bank enable signal; and transferring the row address to the first group in response to the bank group selection signal.

18. The method of claim 17 wherein the plurality of banks are each separated into at least two bank blocks respectively, and each of the bank blocks of one bank are arranged at respective bank areas.

* * * * *